(12) United States Patent
Chang

(10) Patent No.: US 6,429,703 B1
(45) Date of Patent: Aug. 6, 2002

(54) OUTPUT CIRCUIT FOR HIGH-FREQUENCY TRANSMISSION APPLICATIONS

(75) Inventor: Chi Chang, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 09/805,701

(22) Filed: Mar. 13, 2001

(30) Foreign Application Priority Data

Sep. 6, 2000 (TW) ........................................ 89118215 A

(51) Int. Cl.$^7$ .................................................. H03B 1/00
(52) U.S. Cl. ........................ 327/112; 327/379; 326/16; 365/193
(58) Field of Search ................................ 327/291, 292, 327/294, 298, 299, 309, 310, 318–321, 327, 328, 198, 142, 379, 383, 384, 389, 108, 112; 326/16, 83, 86; 365/204, 233.5, 193

(56) References Cited

U.S. PATENT DOCUMENTS

| | | | | |
|---|---|---|---|---|
| 5,461,334 A | * | 10/1995 | Honda | ........................ 327/227 |
| 5,933,027 A | * | 8/1999 | Morris et al. | .................. 326/83 |
| 6,072,729 A | * | 6/2000 | Casper | ......................... 326/83 |
| 6,118,325 A | * | 9/2000 | Nakamura | ................... 327/384 |
| 6,122,221 A | * | 9/2000 | Rezeanu | ................... 365/233.5 |
| 6,166,561 A | * | 12/2000 | Fifield et al. | ............... 327/198 |
| 6,252,417 B1 | * | 6/2001 | Adams et al. | ................ 326/16 |
| 6,262,614 B1 | * | 7/2001 | Sasaki | ........................ 327/379 |

* cited by examiner

Primary Examiner—Terry D. Cunningham
Assistant Examiner—Long Nguyen
(74) Attorney, Agent, or Firm—Darby & Darby

(57) ABSTRACT

An output circuit applied in the double data rate (DDR) system for generating sampling clocks. Assume that the sampling clocks are initially set as a first logic level. The output circuit comprises an output transistor unit for outputting the sampling clock and a pre-pulling unit that connects to an output terminal of the output transistor unit and a second logic level and receives a control signal. The control signal has a pulse before the first time the sampling clock changes from the initial first logic level at the output terminal of the output transistor unit. This pulse can be used to control the pre-pulling unit, so that the output terminal of the output circuit shifts a voltage difference in advance from the first logic level toward the second logic level, thereby preventing initial oscillation of the sampling clock and maintaining the completeness of the data.

17 Claims, 5 Drawing Sheets

OUTPUT CIRCUIT FOR HIGH-FREQUENCY TRANSMISSION APPLICATIONS

BACKGROUND OF THE INVENTION

1. Field of the Invention

The present invention relates to a processing method for high-frequency transmission applications, more particularly, to an output circuit for high-frequency transmission applications, which can avoid the errors of a first set of transmitted data caused by the circuitry factor.

2. Description of the Related Art

Due to the high-speed requirements of electronic systems, the data transmission speed must be raised to meet the needs of the system. There are many techniques for increasing the transmission speed. For example, the double data rate technique, namely, DDR, can be used in synchronized dynamic random access memories (SDRAM) to speed up the original transmission speed. This technique utilizes both the rising edge and the falling edge within a clock signal to acquire double the original data rate under the same timing specification.

FIG. 1 (PRIOR ART) is a sampling timing diagram illustrating the operating principle of the DDR technique. As shown in the figure, sampling clocks STROB and STROB# are complementary pulse signals with a fixed frequency. In addition, the edges of the sampling clocks STROB/STROB# are also opposite, that is, one is the falling edge and the other is the rising edge. For example, at time points S1 and S3, the sampling clock STROB is on the falling edge and the sampling clock STROB# is on the rising edge. At time point S2, the sampling clock STROB is on the rising edge and the sampling pulse STROB# is on the falling edge. Therefore, data on the data signal DATA can be sampled based on these time points S1, S2 and S3. Accordingly, the practical data rate over a transmission line can be doubled by using the same sampling clocks.

FIG. 2 (PRIOR ART) is a circuit diagram of the conventional output circuit for the data signal DATA. As shown in the figure, output data A is sent to buffers 10 and 12, and further to the gates of PMOS transistor 14 and NMOS transistor 16 serially connected, respectively. Thus, the data signal DATA is pulled out from the connected drain electrodes of the PMOS transistor 14 and the NMOS transistor 15. When the output data A to be output is at logic HIGH, the NMOS transistor 16 turns on and the PMOS transistor 14 turns off. In this case, the data signal DATA is 0V (the ground voltage), which represents logic "0". When the output data A to be output is at logic LOW, the PMOS transistor 14 turns on and the NMOS transistor 16 turns off, the data signal DATA is the system voltage VPP, which represents logic "1".

FIG. 3 (PRIOR ART) is a circuit diagram of the conventional output circuit for the sampling clocks STROB/STROB#. Notice that FIG. 3 only demonstrates an output circuit for one of the sampling clocks STROB/STROB# and the output circuits for both of the sampling clocks STROB/STROB# are similar. As shown in the figure, control signals S/S# are sent to buffers 20 and 22, and further to the gates of PMOS transistor 24 and NMOS transistor 26 serially connectedly, respectively. The corresponding sampling clocks STROB/STROB# are pulled out from the connected drain electrodes of the PMOS transistor 24 and the NMOS transistor 26. The signal variations of the sampling clocks STROB/STROB# depend on the control signals S/S#.

However, since the high-frequency data will be affected by the delay effect or other factors during the transmission over the transmission line, the sampling clocks STROB/STROB# usually cannot achieve full swing at the first sampling point. If the sampling clocks STROB/STROB# are going to 1.5V and 0V at the first sampling point, respectively, they cannot achieve these predetermined voltages within the timing specification in practical operation. In this case, since the sampling operation is also affected by other factors, for example, ground/power bounce, IR drop or signal coupling, the extraction of the data signal DATA is probably incorrect.

FIG. 4 (PRIOR ART) is a waveform diagram showing the waveforms of the sampling clocks STROB/STROB# at the first set of data. As shown in the figure, the waveforms of the sampling clocks STROB/STROB# cannot achieve full swing. This could cause the drifting of setup/hold time between the data signal DATA and the sampling clacks STROB/STROB# and the deterioration of the signal eye patttern. As described above, the DDR system extracts data on the data signal DATA based on the opposite crossing point of the sampling clocks STROB/STROB#. Therefore, in the prior art, the extraction of the first set of transmitted data is prone to error.

SUMMARY OF THE INVENTION

Accordingly, an object of the present invention is to provide an output circuit, which can prevent the first set of the transmitted data from being erroneous in high-frequency transmission applications and is especially suitable for transmission systems with the DDR function.

According to the above object, the present invention provides an output circuit, which can output a sampling clock signal, for example, one of the sampling clock signals in the double data rate system. The output terminal of the output circuit is initially set as a first logic level (such as logic "1"). The output circuit includes an output transistor unit having an input terminal and an output terminal serving as the output terminal of the output circuit. In addition, there is a pre-pulled unit, which is connected between the output terminal of the output circuit and a second logic level and receives a control signal. There is a pulse in the control signal before the first time the logic level starts to change at the output terminal of the output transistor unit. This pulse can be used to control the pre-pulled unit, so that the output terminal of the output circuit shifts by a voltage difference toward the second logic level from the initial first logic level. For example, the first logic level corresponds to logic "1". Before the sampling clock signal falls from logic "1" to logic "0" for the first time, the control signal can control the pre-pulled unit to lower the voltage of the original logic "1", thereby guaranteeing the pulse signal correctly falling down to logic "0" at the first conversion time. The above operation also can be applied to the case where the logic "0" rises to logic "1".

In addition, the input terminal of the output transistor unit can be connected to a transmission gate unit, which is used to transmit an input signal to the input terminal of the output transistor unit. The transmission gate unit can be controlled by the control signal. Normally, the input signal can be sent to the input terminal of the output transistor unit via a first channel in the transmission gate unit. During the period of the pulse of the control signal, the input signal can be sent to the input terminal of the output transistor unit via the second channel in the transmission gate unit. The second channel involves a delay time with respect to the first channel to adjust the timing variation introduced by the previously pulling operation.

Furthermore, the present invention also provides an output apparatus of double data rate system, which includes a plurality of data output circuits for the data signals, a first sampling clock output circuit and a second sampling clock output circuit for outputting the first sampling clock and the second sampling clock, respectively. The data signal can be sampled at the intersections of rising edges and falling edges of the first sampling clock and the second sampling clock, thereby doubling the sampling rate. The first sampling clock output circuit and the second sampling clock output circuit can be implemented by the above-described output circuit. It is noted that the logic value of the first sampling clock is opposite to the logic value of the second sampling clock for the sampling purpose of the double data rate system.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENT

The present invention deals with the waveforms of the sampling clocks for sampling a first set of the transmitted data by using a previously pulling operation. For example, the previously pulling operation is to pull down a predetermined voltage from the HIGH level for the sampling clock with an initial logic state "1" and to pull up a predetermined voltage from the LOW level for the sampling clock with an initial logic state "0". Accordingly, the previously pulling operation can lower the oscillation of the waveforms of the sampling clocks induced by the inertia effect, thereby allowing the sampling clocks in the double data rate system to achieve full swing and preventing from erroneous sampling in the first sampling operation. Next, the embodiments will be described in details with reference to figures.

Figure 1:
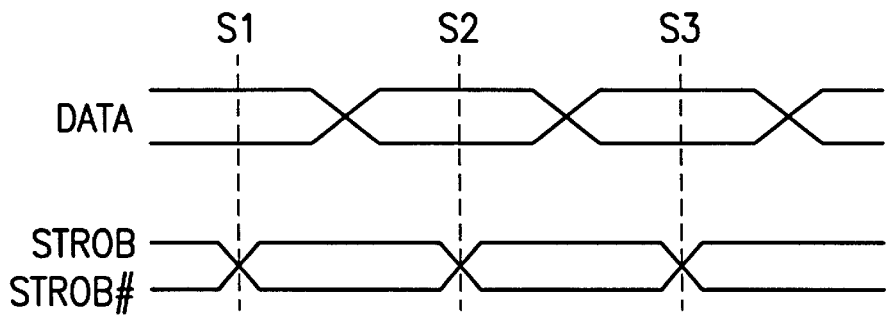
FIG. 1 (PRIOR ART) is a sampling timing diagram illustrating the operating principle of the DDR technique.
Figure 2:
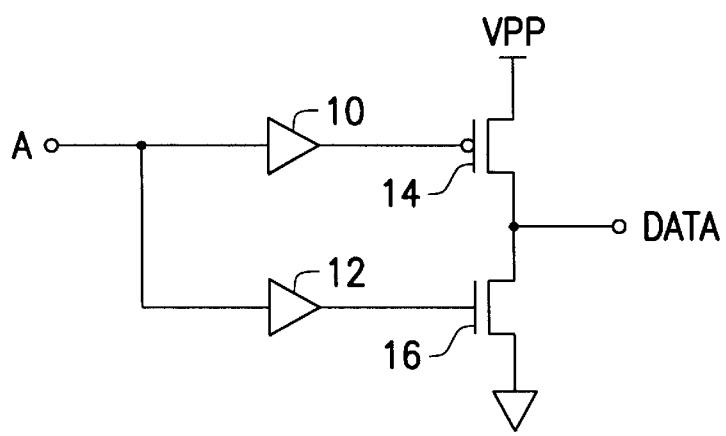
FIG. 2 (PRIOR ART) is a circuit diagram of the conventional output circuit for the output data signal DATA.
Figure 3:
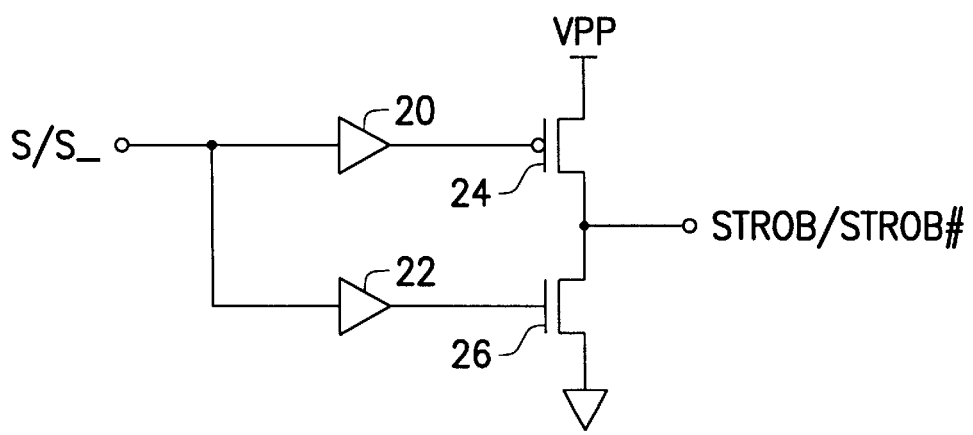
FIG. 3 (PRIOR ART) is a circuit diagram of the conventional output circuit for the sampling clocks STROB/STROB#.
Figure 4:
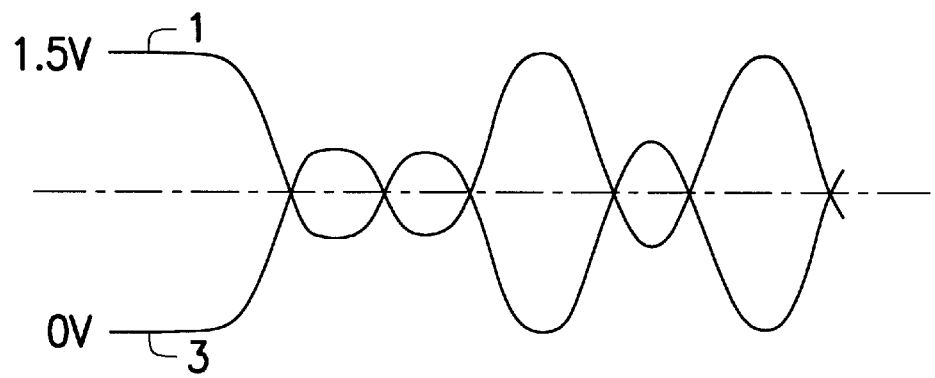
FIG. 4 (PRIOR ART) is a waveform diagram showing the waveforms of the sampling clocks STROB/STROB# at the first set of data.
Figure 5:
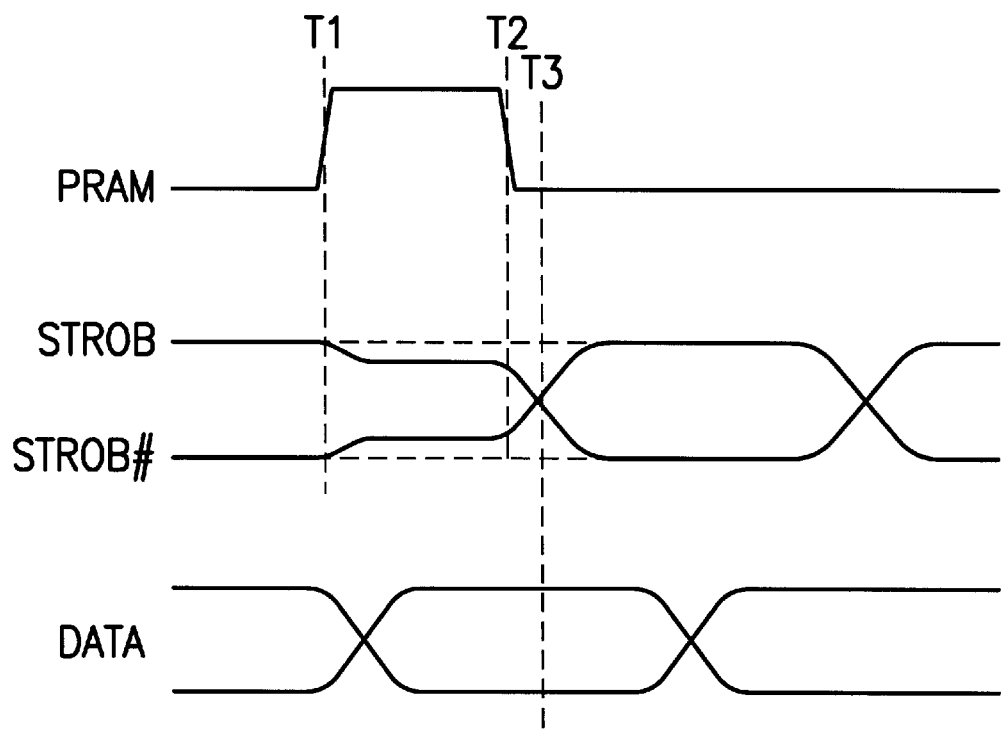
FIG. 5 is a timing diagram of the data signal, the sampling clock signal and the preset signal in the preferred embodiment of the present invention.

FIG. 5 is a signal timing diagram of various signals in the double data rate system in accordance with the preferred embodiment, where PRAM is a pre-pulled control signal, STROB and STROB# are a pair of sampling clock signals and DATA is a data signal. The functions of these signals will be described later. As described above, when a rising edge of one sampling clock (such as STROB) intersects a falling edges of another sampling clock (such as STROB#), the data on the data signal DATA can be fetched.

The main difference between the timing diagram of FIG. 5 and the prior art is the pre-pulled control signal PRAM. Pre-pulled control signal PRAM has a pulse (between time T1 and T2) before data signal DATA (i.e. time T3) is sampled for the first time. As shown in FIG. 5, before time T1, the pre-pulled control signal PRAM is in the LOW voltage level, and the sampling clocks STROB/STROB# are in logic HIGH and logic LOW, respectively. At time T1, the pulse of the pre-pulled control signal PRAM appears and starts to rise to a high voltage. At this time, the sampling clocks STROB/STROB# are activated by pre-pulling and change their voltage levels, where the voltage of the sampling clock STROB decreases from the initial high level by a voltage difference V and the voltage of the sampling clock STROB# increases from the initial low level by the voltage difference V. Note that the previous pulling operation should not change the logic states of the sampling clocks STROB/STROB# and only the actual voltages of the sampling clocks STROB/STROB# are changed to be closer to the logic level to be converted. At time T2, the pulse of the pre-pulled control signal PRAM ends. On the other hand, sampling clocks STROB/STROB# enter into a period of falling/rising edges, respectively, where the sampling clock STROB continues to fall toward the logic LOW level and the sampling clock STROB# continues to raise toward the logic HIGH level. At time T3, the falling edge of the sampling clock STROB intersects the rising edge of the sampling clock STROB#, so the information of the data signal DATA is extracted. Subsequently, the remaining waveforms of the sampling clocks STROB/STROB# can follow the original specifications and the pre-pulling operation activated by the pre-pulled control signal PRAM is no longer needed. In the present embodiment, the pre-pulled operation is used to change the initial voltages of the sampling clocks in advance before the first set of the data is extracted (i.e. two sampling clocks exchange their logic values for the first time). Therefore, the initial oscillating phenomenon can be suppressed to secure the integrity of the first set of transmitted data.

Figure 6:
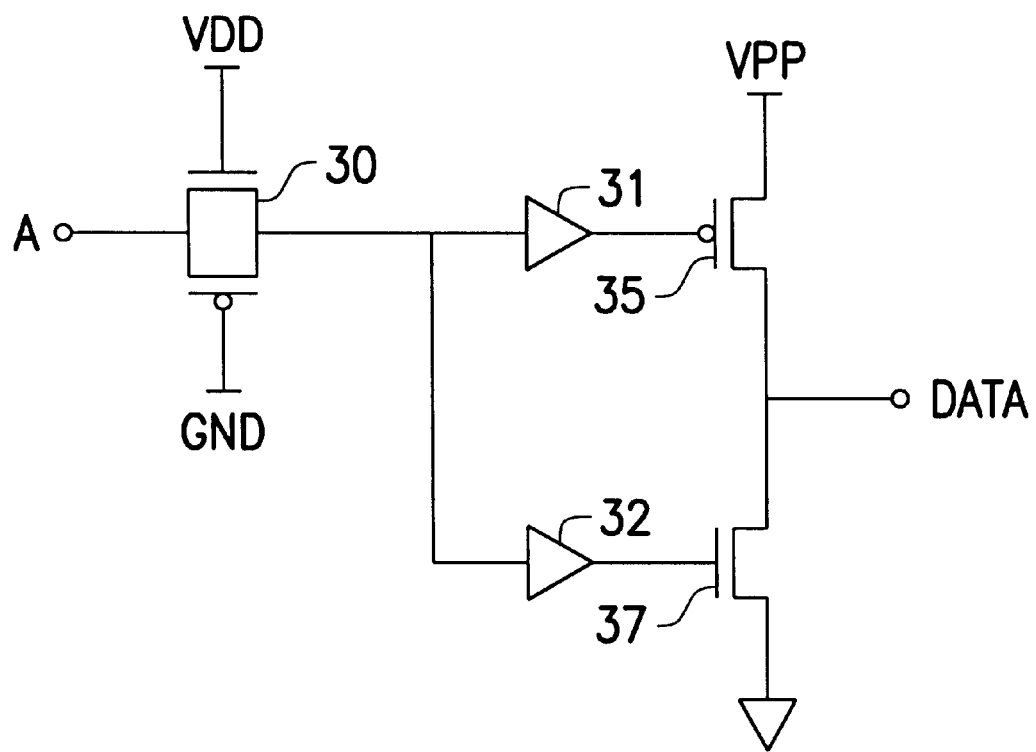
FIG. 6 is a circuit diagram of an output circuit for the output data signal DATA in accordance with the double data rate system of the present invention.

FIG. 6 is a circuit diagram of the output circuit for the data signal DATA in the preferred embodiment. As shown in the figure, the output circuit includes a transmission gate 30, buffers 31 and 32, a PMOS transistor 35 and an NMOS transistor 37. Data A to be output are sent to buffers 31 and 32 respectively via transmission gate 30, thus to the gate connected electrodes of the PMOS transistor 35 and the NMOS transistor 37. Finally, the data signal DATA is generated from the connected drain electrodes of the PMOS transistor 35 and NMOS transistor 37.

Since one of control terminals of the transmission gate 30 is connected to the voltage VDD and another one is connected to the ground, the transmission gate 30 remains conducting. When the data A to be output is in logic "1", the NMOS transistor 37 turns on and the PMOS transistor 35 turns off. Thus, the data signal DATA outputs 0V ground voltage that represents logic "0". When the data A to be output is in logic "0", the PMOS transistor 35 turns on and the NMOS transistor 37 turns off. Data signal DATA then outputs a voltage VPP, that represents logic "1". In this embodiment, the transmission gate 30 is mainly used to adjust the output path delay for the data signal DATA to synchronize with the sampling clocks STROB/STROB# described later.

Figure 7:
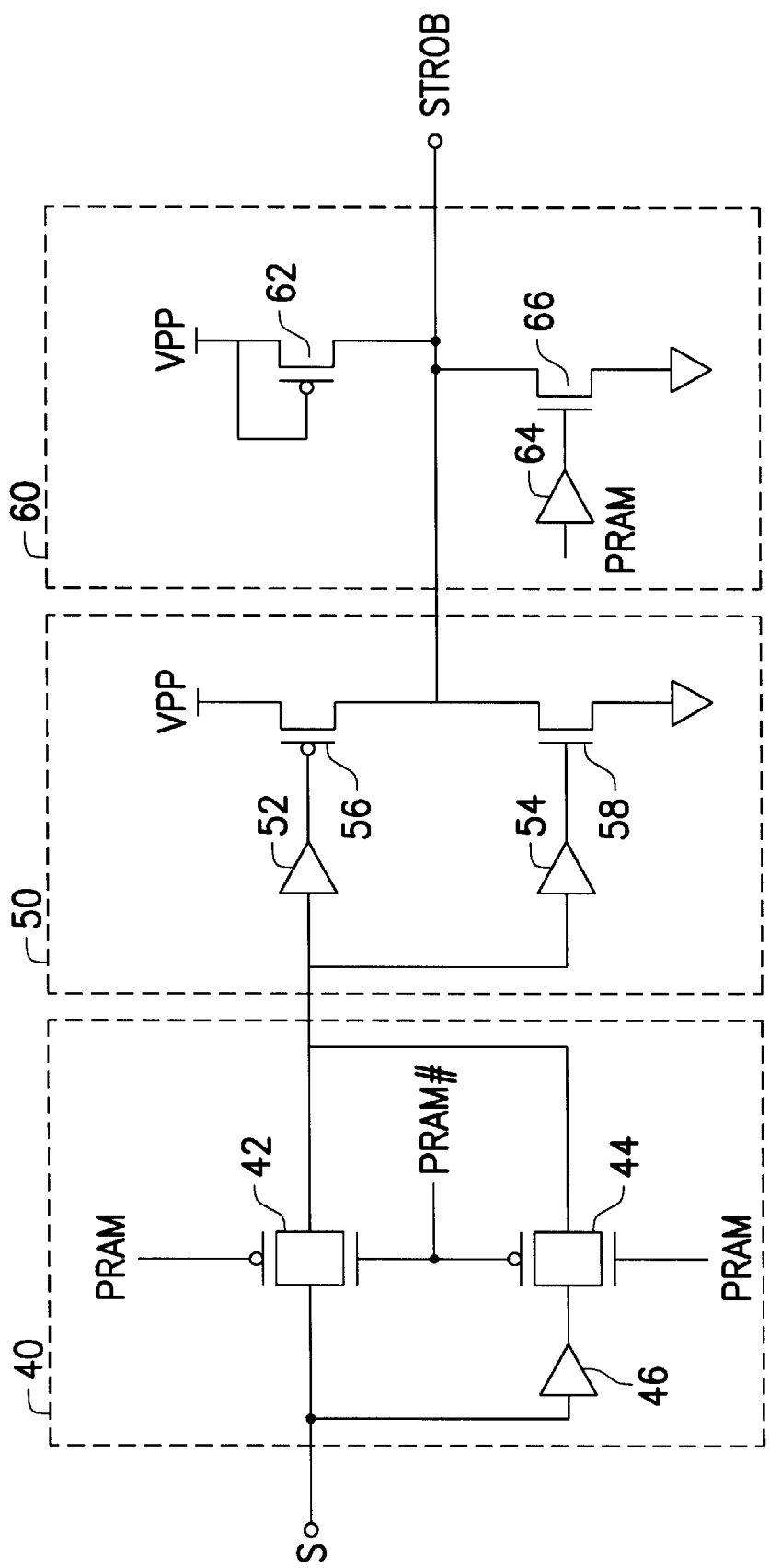
FIG. 7 is a circuit diagram of an output circuit for the sampling clock signal STROB in accordance with the double data rate system of the present invention.
Figure 8:
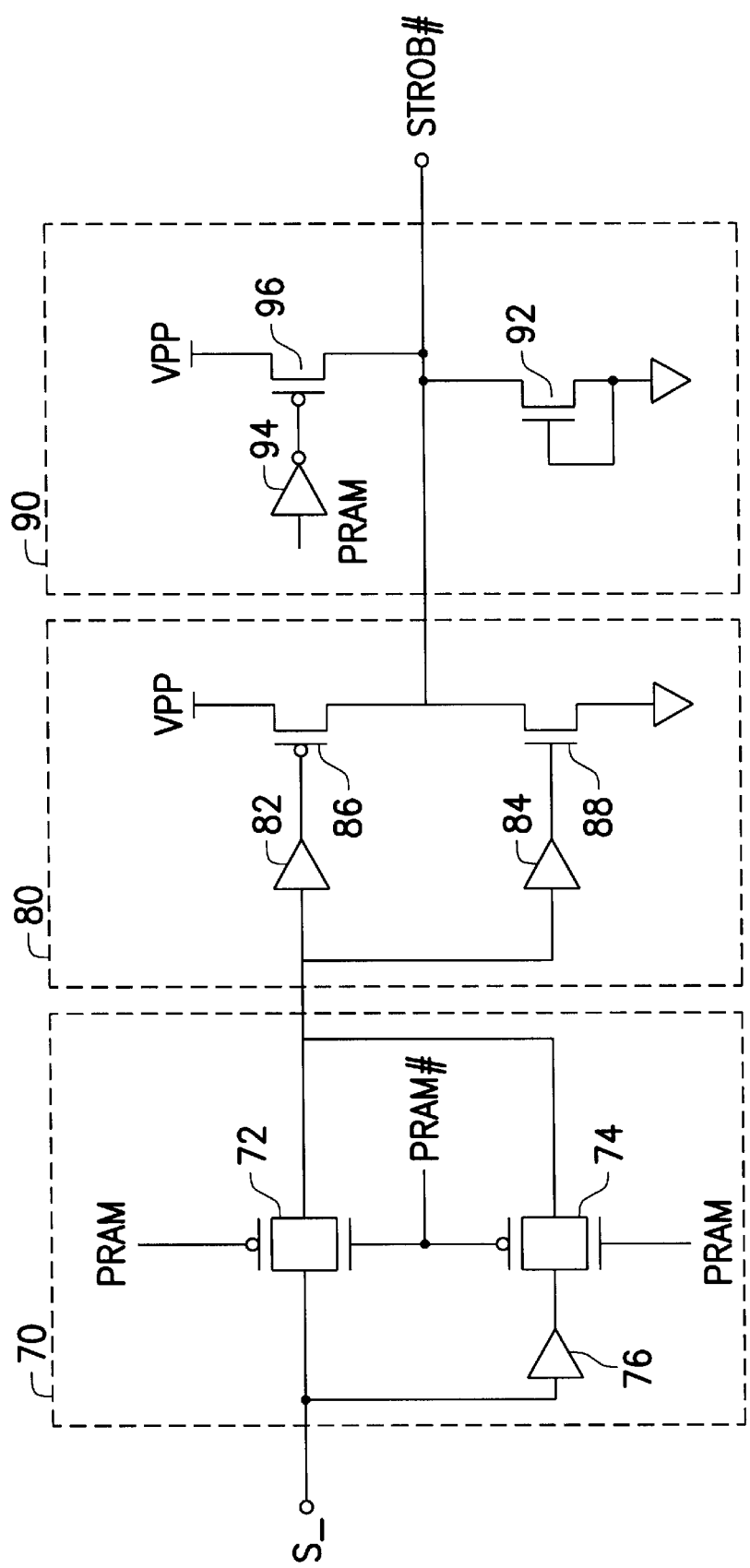
FIG. 8 is a circuit diagram of an output circuit for the sampling clock signal STROB# in accordance with the double data rate system of the present invention.

FIG. 7 shows a circuit diagram of an output circuit for the sampling clock STROB in this embodiment, and FIG. 8 is a circuit diagram of an output circuit for the sampling clock STROB# in this embodiment.

As shown in FIG. 7, the output circuit of the sampling clock STROB includes a transmission gate stage 40, an output transistor stage 50 and a pre-pulled unit 60. The output transistor stage 50 includes buffers 52 and 54, a PMOS transistor 56 and an NMOS transistor 58. The operation of this output transistor stage 50 is basically the same as those described above. Pre-pulled unit 60 includes a PMOS transistor 62 with a source and a gate connected together and a NMOS transistor 66 controlled by the pre-pulled control signal PRAM. Buffer 64 is positioned at the gate of the NMOS transistor 66. Assume that the logic state of the sampling clock STROB is "1". When there is a pulse on the pre-pulled control signal PRAM, the NMOS transistor 66 turns on. Therefore, a conduction route is established between the terminal of the pre-pulled control signal PRAM and the ground terminal. In other words, the voltage of the sampling clock STROB previously starts to fall toward logic "0" by means of the pre-pulling operation. Pre-pulled control signal PRAM only appears before the first set of the transmitted data, so this conducting route will not consume too much power. On the other hand, in the process of the normal data transmission (i.e. not the first set of the transmitted data), the PMOS transistor 62 and NMOS transistor 66 can also be used for electrostatic discharge (ESD).

Furthermore, the transmission gate stage 40 is positioned between a terminal receiving the control signal S and an input terminal of the output transistor stage 50. Accordingly, transmission gate 42 constitutes a first transmission channel, and transmission gate 44 and buffer 46 constitutes a second transmission channel. Transmission gates 42 and 44 are controlled by the pre-pulled control signal PRAM and its inverting signal PRAM#. However, the control effects of both the control signals PRAM/PRAM# are opposite. That is, when the transmission gate 42 turns on, the transmission gate 44 turns off. When the transmission gate 44 turns on, the transmission gate 42 turns off. According to FIG. 7, during the pulse of the pre-pulled control signal PRAM, the control signal S is sent to the output transistor stage 50 via the second transmission channel formed by the transmission gate 44 and the buffer 46. Under other situations, however, the control signal S is sent to the output transistor stage 50 via the first transmission channel formed by the transmission gate 42. Apparently, there is a component delay difference induced by the buffer 46 between the two transmission channels. Since the driving capacity can be enhanced by the pre-pulled operation and thus the original delay time for the second transmission channel will be shortened, the buffer 46 is inserted in the second transmission channel to compensate the timing variations of the sampling clocks and the data signal, such as setup/hold time, introduced by the pre-pulled operation. Similar to the situation illustrated in FIG. 7, the output circuit of the sampling clock STROB# in FIG. 8 includes a transmission gate stage 70, an output transistor stage 80 and a pre-pulled unit 90. In the transmission gate stage 70, a transmission gate 72 constitutes a first transmission channel, which is used to send the control signal S# to the output transistor stage 80 under normal operational conditions. A transmission gate 74 and a buffer 76 constitute a second transmission channel, which is used to send the control signal S# to the output transistor stage 80 during the pulse of the pre-pulling control signal PRAM. Similarly, the buffer 76 is used to compensate the timing variations introduced by the pre-pulling operation.

Output transistor stage 80, including buffers 82 and 84, a PMOS transistor 86 and an NMOS transistor 88, is used to generate the sampling clock STROB# according to the received control signal S#. Pre-pulling unit 90 includes an NMOS transistor 92 with coupled source and gate electrodes and a PMOS transistor 96 controlled by the pre-pulled control signal PRAM. The buffer 94 is positioned at the gate electrode of the PMOS transistor 96. Assume that the sampling clock STROB# is in logic "0". When there is a pulse on the pre-pulled control signal PRAM, the PMOS transistor 96 turns on and thus a conduction route is established between terminals of the pre-pulled control signal PRAM and the voltage VPP. In other words, the voltage of the sampling clock STROB# previously starts to rise toward logic "1" by means of the pre-pulling operation. In addition, during the period for transmitting data rather than the first set, the PMOS transistor 96 and the NMOS transistor 92 can also be used for electrostatic discharge (ESD).

According to the discussion above, a pre-pulling unit coupled to the output terminals of the sampling clocks STROB/STROB# can be used to slightly adjust the voltages of the sampling clocks STROB/STROB# in advance before the first sampling action, thereby preventing the oscillation phenomenon of the sampling clocks and securing the completeness of the first set of the transmitted data. In addition, the additional pre-pulling transistors can be used for electrostatic charging in the remaining transmission process.

While the invention has been described by way of example and in terms of the preferred embodiment, it is to be understood that the invention is not limited to the disclosed embodiments. ON the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An output circuit for outputting a sampling clock signal, which is initially set as a first logic level, comprising:
   an output transistor unit having an input terminal and an output terminal; and
   a pre-pulling unit, coupled to the output terminal of the output transistor unit and a second logic level and controlled by a control signal having a pulse ahead of a change of the sampling clock signal from the initial first logic level, for previously adjusting the sampling clock signal on the output terminal of the output transistor unit from the initial first logic level to the second logic level by a voltage difference according to the pulse of the control signal.

2. The output circuit as claimed in claim 1, wherein the pre-pulling unit is a metal-oxide-semiconductor transistor having a source and a drain connected to the output terminal of the output transistor unit and the second logic level, respectively, and a gate connected to the control signal.

3. The output circuit as claimed in claim 1, wherein the pulse of the control signal is set as logic "1" to turn on the pre-pulling unit and set as logic "0" to turn off the pre-pulling unit.

4. The output circuit as claimed in claim 1, wherein the first logic level and the second logic level are logically reversed.

5. The output circuit as claimed in claim 1, wherein the sampling clock signal output by the output circuit is used as a sampling clock of a double data rate system.

6. The output circuit as claimed in claim 1, further comprising a transmission gate unit, controlled by the control signal, for receiving an input signal and outputting to the input terminal of the output transistor unit; the input signal being sent to the input terminal of the output transistor unit via a first channel in the transmission gate unit, or via a second channel in the transmission gate unit during the period of the pulse of the control signal; the second channel involving a delay time with respect to the first channel.

7. An output circuit of a double data rate system, comprising:
   a data output circuit for outputting a data signal;
   a first sampling clock output circuit for outputting a first sampling clock signal; and
   a second sampling clock output circuit for outputting a second sampling clock signal; the data signal being sampled at the intersection of rising edges and falling edges of the first sampling clock signal and the second sampling clock signal;
   wherein the first sampling clock output circuit comprises a first output transistor unit having an input terminal and an output terminal for outputting the first sampling clock signal initially set as a first logic level; and a first pre-pulling unit, coupled to the output terminal of the first output transistor unit and controlled by a first control signal having a first pulse ahead of a change of the first sampling clock signal from the initial first logic level to a second logic level, for previously adjusting the first sampling clock signal on the output terminal of the first output transistor unit from the initial first logic level toward the second logic level by a first voltage difference according to the pulse of the first control signal; and
   wherein the second sampling clock output circuit comprises a second output transistor unit having an input terminal and an output terminal for outputting the second sampling clock signal initially set as the second logic level; and a second pre-pulling unit, coupled to the output terminal of the second output transistor unit and controlled by a second control signal having a second pulse ahead of a change of the second sampling clock signal from the initial second logic level to the first logic level, for previously adjusting the second sampling clock signal on the output terminal of the second output transistor unit from the initial second logic level toward the first logic level by a second voltage difference according to the pulse of the second control signal.

8. The output circuit of the double data rate system as claimed in claim 7, wherein the first logic level and the second logic level are logically reversed.

9. The output circuit of the double data rate system as claimed in claim 7,
   wherein the first pre-pulling unit is an NMOS transistor connected to the second logic level and the first pulse of the first control signal is used to turn on the NMOS transistor; and
   wherein the second pre-pulling unit is a PMOS transistor connected to the first logic level and the second pulse of the second control signal is used to turn on the PMOS transistor.

10. The output circuit of the double data rate system as claimed in claim 7, wherein the first sampling clock output circuit further comprises a transmission gate unit, controlled by the first control signal, for receiving an input signal and outputting to the input terminal of the first output transistor unit; the input signal being sent to the input terminal of the first output transistor unit via a first channel in the transmission gate unit, or via a second channel in the transmission gate unit during the period of the pulse of the first control signal; the second channel involving a delay time with respect to the first channel.

11. The output circuit of the double data rate system as claimed in claim 7, wherein the second sampling clock output circuit further comprises a transmission gate unit, controlled by the second control signal, for receiving an input signal and outputting to the input terminal of the second output transistor unit; the input signal being sent to the input terminal of the second output transistor unit via a first channel in the transmission gate unit, or via a second channel in the transmission gate unit during the period of the pulse of the second control signal; the second channel involving a delay time with respect to the first channel.

12. An output circuit for outputting a sampling clock signal, which is initially set as a first logic level, comprising:
   an output transistor unit having an input terminal and an output terminal;
   a pre-pulling unit, coupled to the output terminal of the output transistor unit and a second logic level and controlled by a control signal having a pulse ahead of a change of the sampling clock signal from the initial first logic level, for previously adjusting the sampling clock signal on the output terminal of the output transistor unit from the initial first logic level to the second logic level by a voltage difference according to the pulse of the control signal; and
   a transmission gate unit, controlled by the control signal, for receiving an input signal and outputting to the input terminal of the output transistor unit, the input signal being sent to the input terminal of the output transistor unit via a first channel or via a second channel in the transmission gate unit during the period of the pulse of the control signal;
   the second channel involving a delay time with respect to the first channel.

13. The output circuit as claimed in claim 12, wherein the pre-pulling unit is a metal-oxide-semiconductor transistor having a source and a drain connected to the output terminal of the output transistor unit and the second logic level, respectively, and a gate connected to the control signal.

14. The output circuit as claimed in claim 12, wherein the pulse of the control signal is set as logic "1" to turn on the pre-pulling unit and set as logic "0" to turn off the pre-pulling unit.

15. The output circuit as claimed in claim 12, wherein the first logic level and the second logic level are logically reversed.

16. The output circuit as claimed in claim 12, wherein the sampling clock signal output by the output circuit is used as a sampling clock of a double data rate system.

17. A method of a double data rate system for sampling a data signal at the intersection of rising edges and falling edges of a first sampling clock signal and a second sampling clock signal, the method comprising:
   a data output circuit for outputting the data signal;
   a first sampling clock output circuit for outputting the first sampling clock signal; and
   a second sampling clock output circuit for outputting the second sampling clock signal;
   wherein the first sampling clock output circuit comprises a first output transistor unit having an input terminal and an output terminal for outputting the first sampling clock signal initially set as a first logic level;
   and a first pre-pulling unit, coupled to the output terminal of the first output transistor unit and controlled by a first control signal having a first pulse ahead of a change of the first sampling clock signal from the initial first logic level to a second logic level, for previously adjusting the first sampling clock signal on the output terminal of the first output transistor unit from the initial first logic level toward the second logic level by a first voltage difference according to the pulse of the first control signal; and wherein the second sampling clock output circuit comprises a second output transistor unit having an input terminal and an output terminal for outputting the second sampling clock signal initially set as the second logic level;

and a second pre-pulling unit, coupled to the output terminal of the second output transistor unit and controlled by a second control signal having a second pulse ahead of a change of the second sampling clock signal from the initial second logic level to the first logic level, for previously adjusting the second sampling clock signal on the output terminal of the second output transistor unit from the initial second logic level toward the first logic level by a second voltage difference according to the pulse of the second control signal.

* * * * *